US008633756B2

(12) United States Patent
Aude et al.

(10) Patent No.: US 8,633,756 B2
(45) Date of Patent: Jan. 21, 2014

(54) LOW VOLTAGE DIFFERENTIAL SIGNALING (LVDS) CIRCUITRY AND METHOD FOR DYNAMICALLY CONTROLLING COMMON MODE VOLTAGE AT INPUT

(75) Inventors: Arlo J. Aude, Atlanta, GA (US); Soumya Chandramouli, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 87 days.

(21) Appl. No.: 13/188,194

(22) Filed: Jul. 21, 2011

(65) Prior Publication Data

US 2013/0021082 A1    Jan. 24, 2013

(51) Int. Cl.
*H03L 5/00*    (2006.01)
(52) U.S. Cl.
USPC ................ 327/333; 327/108; 326/82; 326/83
(58) Field of Classification Search
None
See application file for complete search history.

(56) References Cited

U.S. PATENT DOCUMENTS

| 5,959,490 A * | 9/1999 | Candage et al. ............... 327/333 |
| 6,111,431 A * | 8/2000 | Estrada ............................ 326/83 |
| 6,359,492 B1 * | 3/2002 | Hipp .............................. 327/333 |
| 6,437,599 B1 * | 8/2002 | Groen ............................. 326/63 |
| 6,504,403 B2 * | 1/2003 | Bangs et al. .................... 327/62 |
| 6,768,352 B1 | 7/2004 | Maher et al. |
| 6,847,232 B2 * | 1/2005 | Tinsley et al. .................. 326/84 |
| 7,236,018 B1 * | 6/2007 | Wang et al. .................... 327/108 |
| 7,482,837 B2 * | 1/2009 | Fagan ............................. 326/82 |
| 7,538,588 B2 * | 5/2009 | Liu et al. ........................ 327/108 |
| 7,579,874 B2 * | 8/2009 | Chen et al. ....................... 326/83 |
| 7,961,014 B2 * | 6/2011 | Behel ............................. 327/108 |
| 8,310,282 B2 * | 11/2012 | Behel ............................. 327/108 |
| 2003/0151431 A1 * | 8/2003 | Morgan et al. ................. 327/108 |
| 2005/0110529 A1 * | 5/2005 | Pradhan et al. ................ 327/108 |
| 2009/0153219 A1 * | 6/2009 | Wu et al. ........................ 327/333 |
| 2010/0073036 A1 * | 3/2010 | Takeuchi et al. ............... 327/108 |
| 2010/0127736 A1 * | 5/2010 | Dixit et al. ..................... 327/108 |
| 2010/0231266 A1 * | 9/2010 | Kishor ............................ 327/108 |

* cited by examiner

*Primary Examiner* — Crystal L Hammond
(74) *Attorney, Agent, or Firm* — Andrew Viger; Wade J. Brady, III; Frederick J. Telecky, Jr.

(57) ABSTRACT

Low voltage differential signaling (LVDS) circuitry and method for dynamically controlling the common mode voltage at the input of an LVDS receiver. The common mode voltage of the incoming LVDS signal is monitored. The common mode voltage at the input of the LVDS receiver is clamped at a clamp voltage when the common mode voltage of the incoming LVDS signal is less than a predetermined voltage, and allowed to track it otherwise.

19 Claims, 2 Drawing Sheets

LOW VOLTAGE DIFFERENTIAL SIGNALING (LVDS) CIRCUITRY AND METHOD FOR DYNAMICALLY CONTROLLING COMMON MODE VOLTAGE AT INPUT

BACKGROUND

1. Field of the Invention

The present invention relates to circuits and methods for transmitting and receiving differential signals, and in particular, to circuits and methods for transmitting and receiving low voltage differential signals (LVDS).

2. Related Art

Low voltage differential signaling was developed to allow transmission of electrical signals at very high speeds over inexpensive twisted pair copper cabling. Operating with a differential input termination of 100 ohms, the original target signal speed was approximately 300 megabits per second. However, since its initial introduction, the speed has been pushed significantly higher. As a result, reliable and consistent circuit operation has become increasingly difficult to maintain with the signal speeds now reaching into gigabits per second.

The LVDS signal requirements include a number of specific challenges, including a common mode voltage range of 0.05-2.25 volts, and input signal amplitude of 200-1200 millivolts (differential peak-to-peak), an input voltage range of 0-2.4 volts, and an input current of less than 20 micro-amps.

With increased signal speeds, LVDS circuits have evolved through a number of implementations involving double differential pairs of transistors. Some have included emitter coupled outputs with transconductances tuning across the common mode voltage range or progressive turnoff. Another implementation is as coupled wrap-around style high gain outputs and progressive turnoff. Yet another implementation uses saturation sense turnoff and coupled current-mode resistive load outputs.

Referring to FIG. 1, a more recent circuit architecture uses an all-pass input network that allows for common mode voltage control, a simple N-MOSFET differential pair with simple resistive loads to maximize signal speed. As shown,, the circuitry is biased between the positive VDD and negative VSS power supply terminals. A current source 2 generates a current I which is conducted by transistor N3 and mirrored by transistor N4 to provide the tail current for the differential amplifier transistors N1, N2. The positive INP and negative INN signal phases of the differential input signal VI are applied to respective all-pass networks R1, C1 and R2, C2 across which is coupled a resistive termination of two serially coupled resistances R3, R4. The mid-point of these equal resistances R3, R4 is driven by a common mode, voltage source VCM to establish the common mode voltage VCM at the gate electrodes of the amplifier transistors N1, N2. The resulting differential output signal VOUT is provided at the drain electrodes of the transistors N1, N2.

This type of circuit has a number of advantages, perhaps not the least of which is that it is very simple. Further, implementations have demonstrated operation in excess of 10 gigabits per second while consuming very low power. Additionally, with the all-pass input networks, the input capacitance is less than that of the differential pair transistors N1, N2.

However, there are some disadvantages as well. Such circuitry requires a large input current for fast operation, and the all-pass filter produces signal losses as high as 9 decibels (dB), thereby requiring multiple gain stages to regain such loss. The use of the resistances R1, R2, R3, R4 at the input results in variations in circuit operation due to variations in the respective resistance values. Further, DC common load current is drawn from the input electrodes VINP, VINN, and the AC transfer function of the all-pass networks varies across PVT (manufacturing Processes, Voltage and Temperature). Additionally, it can be difficult to generate the common mode reference voltage VCM, and thermal noise is introduced by the resistances R1, R2, R3, R4.

Moreover, as an LVDS signal receiver, such circuitry must be capable of receiving signals when the common mode voltage can vary over the full power supply range (0-VDD). However, the amplifier transistors N1, N2 can only respond to signals if the common mode voltage is sufficient to turn these transistors N1, N2 on. Hence, while the common mode voltage network VCM, R3, R4 ensures that the transistors N1, N2 will be turned on, such a resistive network produces a significant signal loss, as noted.

Accordingly, it would be desirable to have an improved LVDS circuit architecture that ensures sufficient common mode voltage at the input, but avoids introducing significant signal loss.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips). Moreover, to the extent that the figures illustrate diagrams of the functional blocks of various embodiments, the functional blocks are not necessarily indicative of the division between hardware circuitry. Thus, for example, one or more of the functional blocks may be implemented in a single piece of hardware.

As discussed in more detail below, LVDS circuitry in accordance with the presently claimed invention is capable of adaptively maintaining a minimum common mode input voltage. This is done using a tracking loop that senses the incoming common mode voltage and compares it to a reference voltage. If the incoming common mode voltage is less than the reference voltage, the common mode of the input circuitry is set to a fixed voltage, such as the reference voltage. Such voltage is established so that the differential amplifier transistors will turn on at all signal corners. If the incoming signal common mode voltages is greater than the reference signal, then the input circuitry is allowed to track the common mode voltage of the incoming LVDS signal. This eliminates the need for a resistive voltage divider at the input, thereby avoiding the introduction of signal loss due to such resistive voltage divider.

Figure 2:
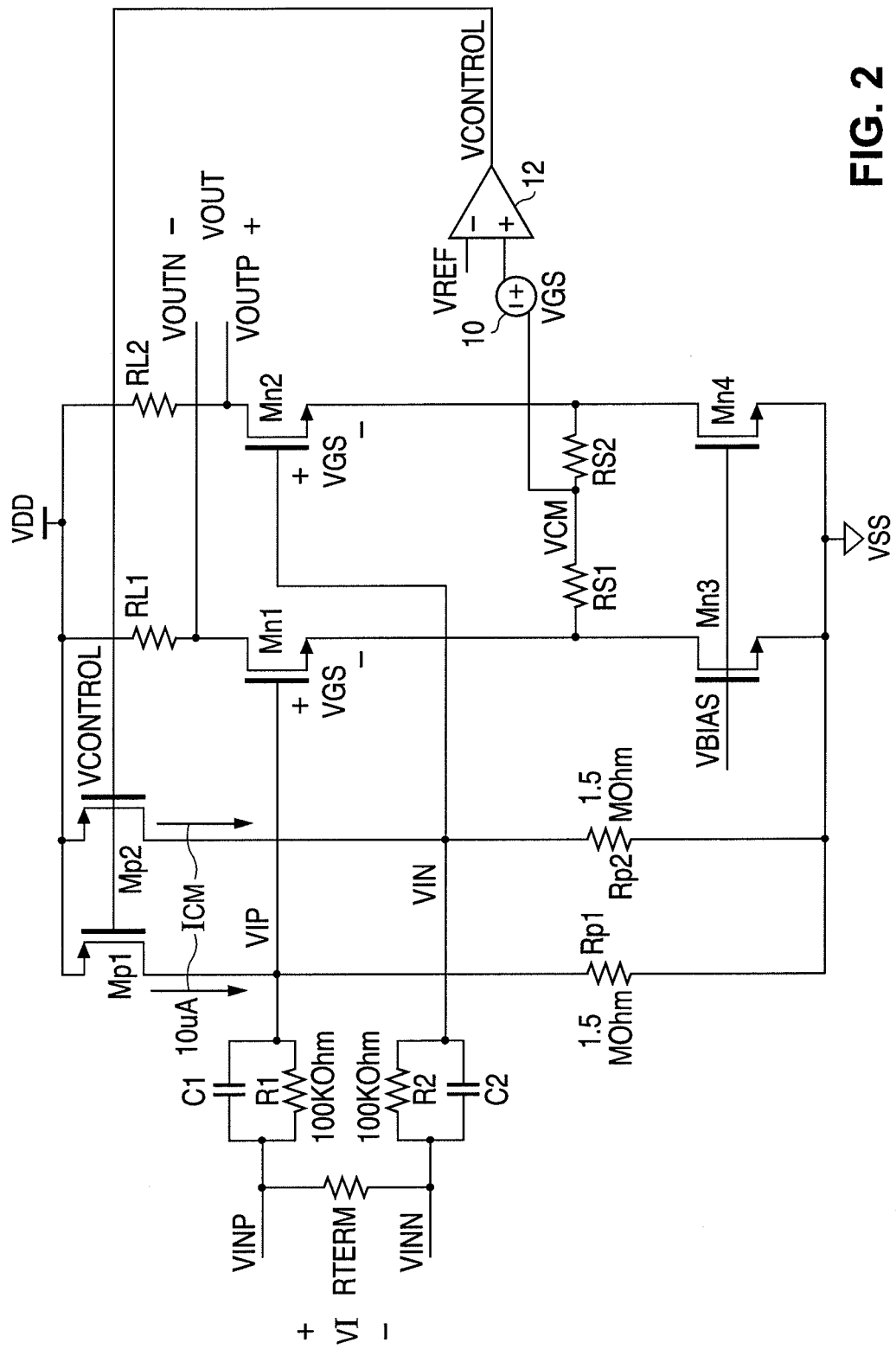
FIG. 2 is a schematic diagram of a LVDS signal receiver in accordance with one embodiment of the presently claimed invention.

Referring to FIG. 2, LVDS circuitry capable of adaptively maintaining a minimum common mode input voltage in accordance with one embodiment of the presently claimed invention can be implemented as shown. As before, all-pass network circuitry R1, C1, R2, C2 is used to couple the phases VINP, VINN of the differential input signal VI to the differential amplifier transistors Mn1, Mn2, which provide a differential output signal VOUT across the load resistances RL1, RL2. The amplifier transistors Mn1, Mn2 receive their currents from respective current sources in the form of additional N-MOSFETs Mn3, Mn4 biased by a bias voltage VBIAS. Coupled between the source electrodes of the amplifier transistors Mn1, Mn2 are two serially coupled resistances RS1, RS2 used for sensing the common mode voltage (discussed in more detail below). A termination resistance RTERM connects the two input signal terminals to establish the proper LVDS termination resistance. The inputs to the differential amplifier, i.e., the gate electrodes of the transistors Mn1, Mn2, are adaptively biased by respective P-MOSFETs Mp1, Mp2 which act as switched current sources in accordance with a control voltage VCONTROL applied at their gate electrodes to provide equal currents ICM via shunt resistances Rp1, Rp2 to adaptively set the common mode voltage at the inputs to the differential amplifier (discussed in more detail below).

As is well known in the art, the incoming LVDS signal VI has positive VINP and negative VINN differential signal phases, which together form the differential signal, or AC, component. The incoming signal VI also has a DC component, which is the common mode voltage, i.e., the DC voltage present at both ends of the input termination resistance RTERM. This DC voltage also appears at the gate electrodes of the amplifier transistors Mn1, Mn2.

During circuit operation, the voltages appearing at the source electrodes of the amplifier transistors Mn1, Mn2 is equal to a difference between the input common mode voltage and the voltage drop VGS from their gate electrodes to their source electrodes, i.e., VIP(DC)-VGS for transistor Mn1, and VINN(DC)-VGS for transistor Mn2. These two equal voltages appear at both ends of the series voltage sensing resistances RS1, RS2. As a result, this voltage VCM, which is related to the input common mode voltage, is applied at the negative electrode of a voltage source 10 providing a DC voltage Vgs equal to the gate-to-source voltages of the amplifier transistors Mn1, Mn2. The positive electrode of this voltage source 10 is applied to the positive input of a voltage comparator 12, the negative input of which is driven by a reference voltage VREF. The output of the voltage comparator 12 provides the control voltage VCONTROL for the switched current source transistors Mp1, Mp2.

Accordingly, when the input common mode voltage, i.e., due to the common mode voltage of the incoming LVDS signal VI, is greater than the reference voltage VREF, the voltage comparator 12 asserts its output voltage VCONTROL to a high state, thereby turning off the switched current source transistors Mp1, Mp2. As a result, the gate electrodes of the amplifier transistors Mn1, Mn2 are allowed to follow, or track, the common mode voltage of the incoming LVDS signal VI. The common mode voltage is sensed at the sources of the input transistors at voltage VCM, which is the true input common mode voltage at the gate electrodes of the amplifier transistors Mn1, Mn2, less the gate-to-source voltage VGS of these transistors Mn1, Mn2. Accordingly, an equivalent voltage VGS is added to this signal prior to its comparison with the reference voltage VREF.

However, if the common mode voltage of the incoming LVDS signal is less than the reference voltage VREF, the voltage comparator 12 output voltage VCONTROL goes to a low state, thereby turning on the switched current source transistors Mp1, Mp2. The resulting currents ICM (e.g., 10 micro-amps) flow through the input resistances R1, R2 (e.g., 100 kilohms) to the input electrodes, due to the low common mode voltage of the incoming LVDS signal VI. This produces a common mode voltage at the gate electrodes of the amplifier transistors Mn1, Mn2 that is equal to a sum of the common mode voltage of the LVDS signal Vi and the voltage produced across the input resistances R1, R2 (e.g., VIP(DC)=VINP(DC)+ICM*R1), This ensures that the common mode voltage appearing at the gate electrodes of the amplifier transistors Mn1, Mn2 is sufficiently high such that these transistors Mn1, Mn2 turn on and off in accordance with the incoming LVDS signal VI. The shunt resistances Rp1, Rp2 are included in case the incoming LVDS signal VI is AC-coupled.

Figure 1:
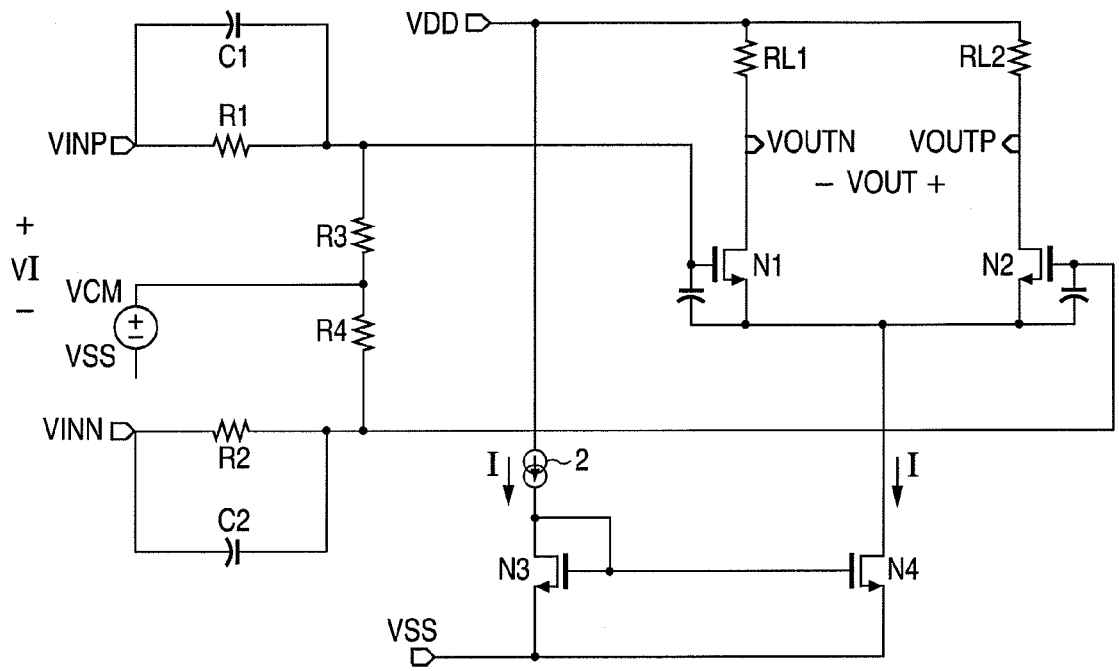
FIG. 1 is a schematic diagram of a conventional LVDS signal receiver.
Figure 3:
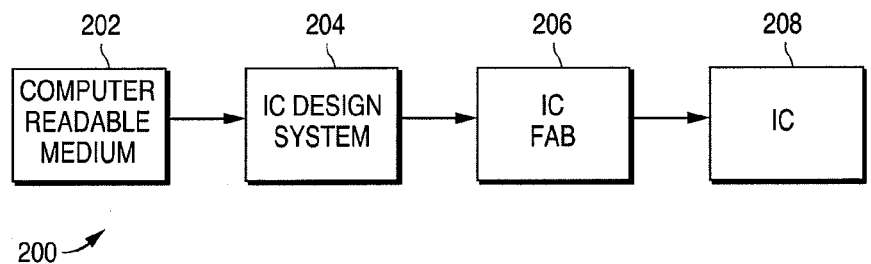
FIG. 3 is a functional block diagram of an exemplary embodiment of an integrated circuit design and fabrication system operated in accordance with computer instructions.

Referring to FIG. 3, integrated circuit (IC) design systems 204 (e.g., work stations, or other forms of computers with digital processors) are known that create integrated circuits based on executable instructions stored on a computer readable medium 202, e.g., including memory such as but not limited to CD-ROM, DVD-ROM, other forms of ROM, RAM, hard drives, distributed memory, or any other suitable computer readable medium. The instructions may be represented by any programming language, including without limitation hardware descriptor language (HDL) or other suitable programming languages. The computer readable medium contains the executable instruction (e.g., computer code) that, when executed by the IC design system 204, cause an IC fabrication system 206 to produce an IC 208 that includes the devices or circuitry as set forth herein. Accordingly, the devices or circuits described herein may be produced as ICs 208 by such IC design systems 204 executing such instructions.

Various other modifications and alternations in the structure, and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including low voltage differential signaling (LVDS) circuitry capable of adaptively maintaining a minimum common mode input voltage, comprising:

LVDS amplifier circuitry including input circuitry and output circuitry, and responsive to a LVDS input signal that includes a signal voltage and an input common mode voltage by providing a corresponding LVDS output signal and a voltage related to said input common mode voltage;

voltage sensing circuitry coupled to said LVDS amplifier circuitry and responsive to said voltage related to said common mode voltage by providing at least one control signal; and voltage clamping circuitry coupled to said voltage sensing circuitry and said LVDS amplifier circuitry and responsive to said voltage sensing circuitry and said LVDS amplifier circuitry and responsive to said at least one control signal by clamping first and second common mode voltages within said input circuitry at a clamp voltage when said input common mode voltage is less than a predetermined reference voltage, and allowing said first and second common mode voltages within said input circuitry to track said input common mode voltage otherwise.

2. The apparatus of claim 1, wherein said input circuitry comprises an all-pass network.

3. The apparatus of claim 1, wherein said output circuitry comprises a differential amplifier circuit.

4. The apparatus of claim 1, wherein:
said input circuitry comprises an all-pass network; and
said output circuitry comprises a differential amplifier circuit.

5. The apparatus of claim 1, wherein said output circuitry comprises a differential amplifier circuit including:
a first circuit branch including a first current source, a first transistor and a first resistance mutually coupled in series; and
a second circuit branch including a second current source, a second transistor and a second resistance mutually coupled in series.

6. The apparatus of claim 1, wherein said voltage sensing circuitry comprises voltage comparison circuitry coupled to said output circuitry.

7. The apparatus of claim 1, wherein said voltage sensing circuitry comprises:
a resistive network coupled to said output circuitry and responsive to said voltage related to said common mode voltage by providing a sense voltage; and
voltage comparison circuitry coupled to said resistive network and responsive to said sense voltage and a reference voltage by providing said at least one control signal.

8. The apparatus of claim 1, wherein said voltage .clamping circuitry comprises:
current source circuitry responsive to said at least one control signal by providing one or more currents each having a respective one of a plurality of values in accordance with said at least one control signal; and
resistive circuitry coupled to said current source circuitry and responsive to said one or more currents by providing said clamp voltage.

9. The apparatus of claim 8, wherein each of said one or more currents has:
a first one of said plurality of values when said input common mode voltage is less than said predetermined reference voltage; and
a second one of said plurality of values otherwise.

10. A system for low voltage differential signaling (LVDS) capable of adaptively maintaining a minimum common mode input voltage, comprising:

a signaling interface coupled to a data communication link, and configured for at least one of receiving and transmitting LVDS signals;

an LVDS signaling circuit coupled to the signaling interface, and including

LVDS amplifier circuitry including input circuitry and output circuitry; and responsive to a LVDS input signal that includes a signal voltage and an input common mode voltage by providing a corresponding LVDS output signal and a voltage related to said input common mode voltage, voltage sensing circuitry coupled to said LVDS amplifier circuitry and responsive to said voltage related to said common mode voltage by providing at least one control signal, and voltage clamping circuitry coupled to said voltage sensing circuitry and said LVDS amplifier circuitry and responsive to said at least one control signal by clamping first and second common mode voltages within said input circuitry at a clamp voltage when said input common mode voltage is less than a predetermined reference voltage, and allowing said first and second common mode voltages within said input circuitry to track said input common mode voltage otherwise.

11. The system of claim 10, wherein said output circuitry comprises a differential amplifier circuit including:
a first circuit branch including a first current source, a first transistor and a first resistance mutually coupled in series; and
a second circuit branch including a second current source, a second transistor and a second resistance mutually coupled in series.

12. The system of claim 10, wherein said voltage sensing circuitry comprises voltage comparison circuitry coupled to said output circuitry.

13. The system of claim 10, wherein said voltage sensing circuitry comprises:
a resistive network coupled to said output circuitry and responsive to said voltage related to said input common mode voltage by providing a sense voltage; and
voltage comparison circuitry coupled to said resistive network and responsive to said sense voltage and said predetermined reference voltage by providing said at least one control signal.

14. The system of claim 10, wherein said voltage clamping circuitry comprises:
current source circuitry responsive to said at least one control signal by providing one or more currents each having a respective one of plurality of values in accordance with said at least one control signal; and
resistive circuitry coupled to said current source circuitry and responsive to said one or more currents by providing said clamp voltage.

15. The system of claim 14, wherein each of said one or more currents has:
a first one of said plurality of values when said input common mode voltage is less than said predetermined reference voltage; and
a second one of said plurality of values otherwise.

16. A method of adaptively maintaining a minimum common mode input voltage for use in connection with low voltage differential signaling (LVDS) circuitry, comprising:
responding to a LVDS input signal that includes a signal voltage and an input common mode voltage by providing a corresponding LVDS output signal and a voltage related to said input common mode voltage;

responding to said voltage related to said input common mode voltage by providing at least one control signal; and responding to said at least one control signal by clamping first and second common mode voltages within said input circuitry at a clamp voltage when said input common mode voltage is less than a predetermined reference voltage; and allowing said first and second common mode voltages within said input circuitry to track said input common mode voltage otherwise.

17. The method of claim 16, wherein said responding to said voltage related to said input common mode voltage by providing at least one control signal comprises:

sensing said voltage related to said input common mode voltage by providing a sense voltage; and comparing said sense voltage and said predetermined reference voltage to provide said at least one control signal.

18. The method of claim 16, wherein said responding to said at least one control signal comprises:

providing one or more currents each having a respective one of a plurality of values in accordance with said at least one control signal; and responding to said one or more currents by providing said clamp voltage.

19. The method of claim 18, wherein each of said one or more currents has:

a first one of said plurality of values when said input common mode voltage is less than said predetermined reference voltage; and a second one of said plurality of values otherwise.

* * * * *